United States Patent [19]
Yoo et al.

[11] Patent Number: 5,963,773
[45] Date of Patent: Oct. 5, 1999

[54] TUNGSTEN SKELETON STRUCTURE FABRICATION METHOD EMPLOYED IN APPLICATION OF COPPER INFILTRATION AND TUNGSTEN-COPPER COMPOSITE MATERIAL FABRICATION METHOD THEREOF

[75] Inventors: Myoung Ki Yoo, Koyang; Jong Ku Park, Namyangjoo; Kyung Tae Hong; Ju Choi, both of Seoul, all of Rep. of Korea

[73] Assignee: Korea Institute of Science and Technology, Seoul, Rep. of Korea

[21] Appl. No.: 09/096,741

[22] Filed: Jun. 12, 1998

[30] Foreign Application Priority Data

Jun. 14, 1997 [KR] Rep. of Korea ............... 97-24736

[51] Int. Cl.$^6$ .................................................. B22F 3/16
[52] U.S. Cl. ................... 419/27; 419/2; 419/23; 419/35; 419/37
[58] Field of Search .................... 419/2, 23, 27, 419/35, 37; 75/248

[56] References Cited

U.S. PATENT DOCUMENTS

| | | |
|---|---|---|
| 4,498,395 | 2/1985 | Kock et al. . |
| 4,788,627 | 11/1988 | Ehlert et al. . |
| 4,942,076 | 7/1990 | Panicker et al. . |
| 4,988,386 | 1/1991 | Oenning et al. ............ 75/247 |
| 5,342,573 | 8/1994 | Amano et al. ............. 319/38 |
| 5,563,101 | 10/1996 | Osada et al. ............. 437/209 |
| 5,574,959 | 11/1996 | Tsujioka et al. ............ 419/2 |

OTHER PUBLICATIONS

N.M. Parikh, M. Humenik, Jr., "Cermets: II, Wettability andMicrostructure Studies in Liquid–Phase Sintering", Journal of The American Ceramic Society, vol. 40, No. 9, 315–320, 1957.

J.L. Johnson, K.F. Hens, R.M. German, "W–Cu and Mo–Cu for Microelectronic Packaging Applications: Processing Fundamentals", Tungsten and Refractory Metals–1994, Proceedings, Ed.A.Bose and R.J. Dowding, MPIF, Princeton, NJ. 245–252, 1994.

B. Yang, R.M. German, "Study on Powder Injection Molding Ball Milled W–Cu Powders", ibid, 237–244.

V.N. Eremenko, R.V. Minakova, M.M. Churakov, "Solubility of Tungsten in Copper–Nickel Melts", Soviet Powder Mettalurgy and Metal Ceramics, Translated from Poroshkovaya Metallurgiya, No. 4, 55–58, 1977.

S.K. Joo, S.W. Lee, T.H. Ihn, "Effect of Cobalt on the Liquide–Phase Sintering of W–Cu Prepared by the Fluidized Bed Reduction Method", Metallurgical and Materials Transactions A., vol. 25A, 1575–1578, 1994.

J.L. Johnson, R.M. German, "Phase Equilibria Effects on the Enhanced Liquid Phase Sintering of Tungsten–Copper", Metallurgical Transactions A. vol. 24A, 2369–2377, 1993.

Y.Kai, C. Yamasaki, K. Yukuhiro, T. Okabe, "The Manufacturing Near Net Shape of Cu–W Composite Materials", Tungsten and Refractory Metals–1994, Proceedings, Ed. A. Bose and R.J. Dowding, MPIF, Princeton, NJ, 253–258, 1995.

Primary Examiner—Ngoclan Mai
Attorney, Agent, or Firm—Scully,Scott,Murphy Presser

[57] ABSTRACT

A tungsten skeleton structure fabrication method employed in an application of a copper infiltration and tungsten-copper composite fabrication method includes the steps of forming a source powder by coating the tungsten powder surface having a purity of 99.9 weight percent and 2~5 $\mu$m in size, with nickel by less than 0.06 weight percent (600 ppm), forming an injection molded admixture by admixing a source powder and a polymer binder, carrying out a powder injection molded with regard to the admixture, and obtaining a tungsten skeleton structure by removing the polymer binder from the resultant injection molded body. The method prevents the molded body from being unevenly shrunken during a liquid phase sintering for thereby decreasing its production cost.

2 Claims, 3 Drawing Sheets

1250°C

1500°C

TUNGSTEN SKELETON STRUCTURE FABRICATION METHOD EMPLOYED IN APPLICATION OF COPPER INFILTRATION AND TUNGSTEN-COPPER COMPOSITE MATERIAL FABRICATION METHOD THEREOF

BACKGROUND OF THE INVENTION

1. Field of the Invention

The present invention relates to a tungsten skeleton structure fabrication method employed in application of a copper infiltration and tungsten-copper composite material fabrication method thereof capable of preventing injection molded body from being unevenly infiltrated during a liquid phase sintering thereof.

2. Description of the Prior Art

A semiconductor device provided on a substrate and composing of a circuit produces heat when an electrical power is supplied thereto. The heat produced may damage functions or the integrity of the circuit, and thus a heat sink which serves to efficiently eliminate heat needs to be attached to the substrate, for thereby optimizing the circuit operation.

Materials for the heat sink must be provided with a high thermal conductivity so that heat cannot accumulate on attached interfaces, and further a thermal expansion coefficient of a heat sink material must be similar to that of the semiconductor substrate to avoid a thermal stress build-up.

When the heat sink is comprised of a tungsten-copper composite material, the respective functions of a GaAs FET and a GaAs MMIC for a microwave device can be improved, as disclosed in U.S. Pat. Nos. 4,942,076/4,988,386/5,563,101. This is because tungsten particles with low thermal expansion coefficient are evenly dispersed within a copper matrix having a high thermal conductivity, thus improving the thermal conductivity of the heat sink. Also, the thermal expansion coefficient of the tungsten-copper heat sink desires to correspond to the thermal expansion coefficient (6.7 ppm/°C.) of a GaAs substrate.

However, tungsten W is a metallic element having a high melting point (3410° C.) and a high density (19.3 g/cm$^3$) but copper Cu, also a metallic element, but with a low melting point (1083° C.) and a low density (8.96 g/cm$^3$) relative to that of tungsten W, therefor it is difficult to fabricate respective composite materials having an evenly fine structure using the two metals in accordance with a general melting and forming method. In order to overcome such a difficulty, a powder metallurgy technique was employed as disclosed by N. M. Parikh and M. Humenik JR, J. Amer. Cer. Soc., Vol. 40 1957, pp. 315–320, and in Korea Patent Publication No. 96-15218.

A liquid phase sintering and a Cu-infiltrating method are employed to fabricate a tungsten-copper composite material in the powder metallurgy application. In the liquid phase sintering (as disclosed in B. Yang and R. M. German, Tungsten and refractory Metals-1994, eds. A, Mose and R. J. Dowding MPIF, Princeton, N.J., 1995, pp. 237–244), a tungsten powder and a copper powder are admixed and the admixture is sintered for several hours at a temperature ranging from 1150~1550° C., thus the temperature range is higher than the melting point of copper. In the Cu-infiltrating method, first the powder tungsten is molded and sintered in a preliminary step, a tungsten skeleton structure is fabricated wherein the liquid copper is infiltrated by capillary force.

When it comes to a liquid phase sintering, a solid solubility of tungsten into liquid copper is less than 10$^{-7}$ weight percent, which may be virtually ignored, at a temperature ranging from 1300~1400° C. (V. N. Eremenko, R. V. Minakova and M. M. Churakov. (Poroshkovaya Metallurgiya, No. 4, 1977, pp. 55–58)/Seung-Ki Joo, Seok-Woon Lee and Tae-Hyoung Ihn, Metall. and Mater. Trans. A, vol. 25A, 1994, pp. 1575–1578)

The wettability of liquid copper against tungsten surface is poor, and it is difficult to completely remove all pores in the tungsten-copper sintered bodies. Therefore, trace amount of transition metals, such as Ni, Co and Fe are added thereto to improve wettability and sintered, as disclosed in U.S. Pat. No. 4,788,627/J. L. Johnson and R. M. German, Metall. Trans. A, vol. 24A, 1993, pp. 2369–2377/Seung-Ki Joo, Seok-Woon Lee and Tae Hyoung Ihn, Metall. and Mater. Trans. A, vol. 25A, 1994, pp. 1575–1578. The transition metals improve the wettability of copper, and yet form a solution with the copper. Also, an amount of the transition metals sufficient to form an intermetallic compound with the tungsten is added, so as to urge an inter-grain boundary diffusion of the tungsten, thus improving sinterability. However, a sudden shrinkage occurring during the liquid phase sintering makes it difficult to control its shaping when a sinter body has a complicated form, and at the same time the added transition metal deteriorates the thermal conductivity of the copper.

In the Cu-infiltration method for the fabrication of the tungsten-copper composite, the transition metals are not added as in the liquid phase sintering method; instead, a liquid copper is infiltrated by controlling the tungsten skeleton structure for thereby fabricating a Cu-network structure in which the copper is evenly distributed, whereby the thermal conductivity is improved relative to that of the tungsten-copper composite fabricated by the liquid phase sintering. In particular, when the above-described tungsten skeleton structure fabrication method employs the activation sintering of pure tungsten instead of a liquid phase sintering by adding transition metals, a sudden shrinkage does not occur during sintering, for thereby facilitating a molding and size control of the shaping body, as disclosed in Y. Kai, C. Yamasaki, K. Yukuhiro and T. Okabe, Tungsten and Refractory Metals-1994. eds. A. Bose and R. J. Dowding, MPIF, Princeton, N.J. 1955, pp. 253–258. However, in order to fabricate a W—Cu(10~20 wt. %) composite material having a high thermal conductivity and a thermal expansion coefficient similar to that of a GaAs substrate, the tungsten skeleton structure must be adjusted to have a porosity of 20~35% (=1-{shaped body density/19.3}]×100).

Also, in order to fabricate the preliminary tungsten sintered body with such a porosity, the sintering must be carried out at a temperature of 1500° C. for extended period of time. Accordingly, in order to obtain such a high sintering temperature, a heating furnace using heating elements of MoSi$_2$, tungsten W, or graphite, is required. Here, a high sintering temperature denotes a high energy input which causes the cost of the fabrication to increase.

SUMMARY OF THE INVENTION

Therefore, it is an object of the present invention to provide a tungsten skeleton structure fabrication method employed in an application of a copper infiltration and a tungsten-copper composite fabrication method thereof capable of minimizing the reduction of a thermal conductivity resulting from an addition of transition metals while facilitating the fabrication of the tungsten skeleton structure in which copper is infiltrated at a low temperature, and avoiding a sudden shrinkage during sintering.

It is another object of the present invention to provide the tungsten skeleton structure fabrication method and tungsten-copper composite fabrication method in the application of the copper infiltration which makes it possible to fabricate the tungsten-copper composite at a lower cost.

To achieve the above-described objects, the tungsten frame structure fabrication method employed in the application of the copper infiltration and tungsten-copper composite fabrication method according to the present invention includes the steps of forming a source powder by coating a tungsten powder surface having a purity of 99.9 weight percent and 2~5 μm in size, with nickel by less than 0.06 weight percent (600 ppm), forming an injection-molded part by admixing the source powder and a polymer binder, carrying out a powder injection molding with regard to the admixture, and obtaining a tungsten skeleton structure by removing the polymer binder from the obtained injection molded body and then by sintering with it.

Further, to achieve the above-described objects, the tungsten frame structure fabrication method employed in the application of the copper infiltration and tungsten-copper composite fabrication method according to the present invention includes the steps of forming a source powder by coating a tungsten powder surface having a purity of 99.9 weight percent and 2~5 μm in size, with nickel by less than 0.06 weight percent (600 ppm), forming an injection molding admixture by admixing the source powder and a polymer binder, carrying out a powder injection molding with the admixture, obtaining a tungsten skeleton structure by removing the polymer binder from the obtained injection molded body, fabricating a tungsten skeleton structure having a porosity of 15–40% by sintering the tungsten skeleton structure at a temperature ranging from 1000~1500° C. for 0.5 through 5 hours, and providing a copper plate beneath the tungsten skeleton structure and carrying out a copper infiltration at a temperature 1150° C. and 1250° C. under a hydrogen atmosphere for 2 hours.

BRIEF DESCRIPTION OF THE DRAWINGS

The present invention will become better understood with reference to the accompanying drawings which are given only by way of illustration and thus are not limitative of the present invention, wherein.

DETAILED DESCRIPTION OF THE INVENTION

Figure 1:
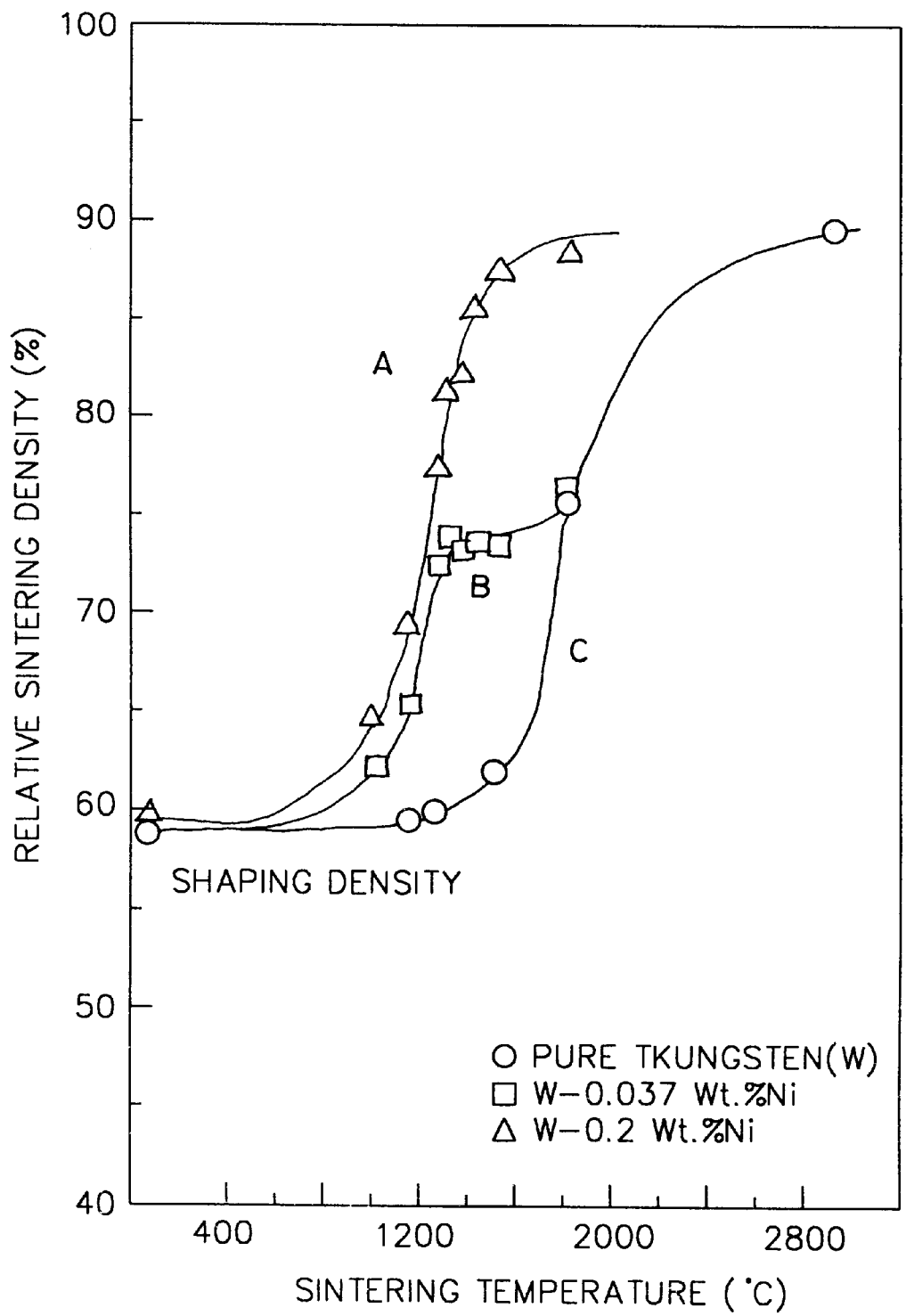
FIG. 1 is a graph illustrating relative sinterred density variation curves of a pure tungsten powder A, a W—Ni (0.037 wt %) powder B according to the present invention, and a W—Ni(0.2 wt %) powder C, versus temperature (°C.) wherein the relative sinterred densities are incorporated depending on a sintering temperature carried out for one hour in pure tungsten powders and tungsten powder coated with nickel.

The tungsten skeleton structure fabrication method employed in an application of a copper infiltration and a tungsten-copper composite fabrication method according to the present invention includes the steps of: forming a source powder by coating a tungsten powder surface having a purity of 99.9 weight percent and 2~5 μm in size, with nickel by less than 0.06 weight percent (600 ppm); forming an injection admixture by admixing the source powder and a polymer binder; carrying out a powder injection molding with regard to the admixture; and obtaining a tungsten skeleton structure by removing the binder from the obtained injection molded body and by sintering.

Further, the fabrication method employed in the application of the copper infiltration and the tungsten-copper composite fabrication method according to the present invention includes first fabricating a tungsten skeleton structure by the method including the steps of: forming a source powder by coating a tungsten powder surface having a purity of 99.9 weight percent and 2~5 μm in size, with nickel having less than 0.06 weight percent (600 ppm); forming an injection admixture by admixing the source powder and a polymer binder; carrying out a powder injection molding with regard to the admixture; and obtaining a tungsten skeleton structure by removing the binder from the obtained injection molded body; and then fabricating the obtained tungsten skeleton structure to have a porosity of 15~40% by sintering the tungsten skeleton structure at a temperature ranging from 1000~1500° C. for 0.5 through 5 hours; and putting a copper plate beneath the tungsten skeleton structure and carrying out the copper penetration at a temperature of 1250° C. under a hydrogen atmosphere for 2 hours to infiltrate copper into the pores in the tungsten skeleton structure to thereby form a W—Cu composite.

The solubility of nickel Ni for the tungsten powder remains significantly low at 0.06 wt %; however, when nickel Ni is coated on the surface of the tungsten powder, the nickel Ni serves as a diffusion path, for thereby improving the sintering characteristic thereof, and when coated on the surface of tungsten powder at a level of less than nickel Ni is 0.06 wt % of solid solubility with respect to the tungsten, there does not occur a tungsten interface precipitation, but the nickel Ni dissolves into the tungsten during the sintering, and thus does not aggravate a thermal conductivity thereof. In general, when powder molding is carried out using only a metallic powder without a binder, a stress distribution difference in the interior of the molded body is produced, wherein the difference is induced by a friction between the powder particles or between the powder and die wall incurring the uneven warpage of the molding body during the sintering. In contrast, when a tungsten powder and a polymer binder are combined, injected into a certain shape and debinded, such an uneven warpage problem of molded body during the sintering is eliminated. A W—Cu(10~20 wt %) composite material is fabricated to have an even structure by infiltrating copper with respect to the tungsten skeleton structure having a porosity of 20~35% after sintering at a temperature of 1200~1300° C.

With reference to the accompanying drawings, the fabrication method of tungsten skeleton structure employed in the application of the copper infiltration and the tungsten-copper composite fabrication method will be described in detail.

As shown in FIG. 1, the relative sintering density variation of curve B (tungsten powder coated with a 0.037 wt % nickel) indicates a characteristic in which the sintering density increases in accordance with an increasing temperature and the sintering density stops increasing at a temperature ranging from 1200~1500° C. which is different from curve C (pure tungsten without any nickel coating), and curve A (tungsten coated with a 0.2 wt % of nickel). Such a characteristic serves to decrease a porosity deviation of a molding body with regard to a temperature deviation within the heating furnace during the tungsten skeleton structure fabrication for thereby improving an homogeneity of products.

Figure 2:
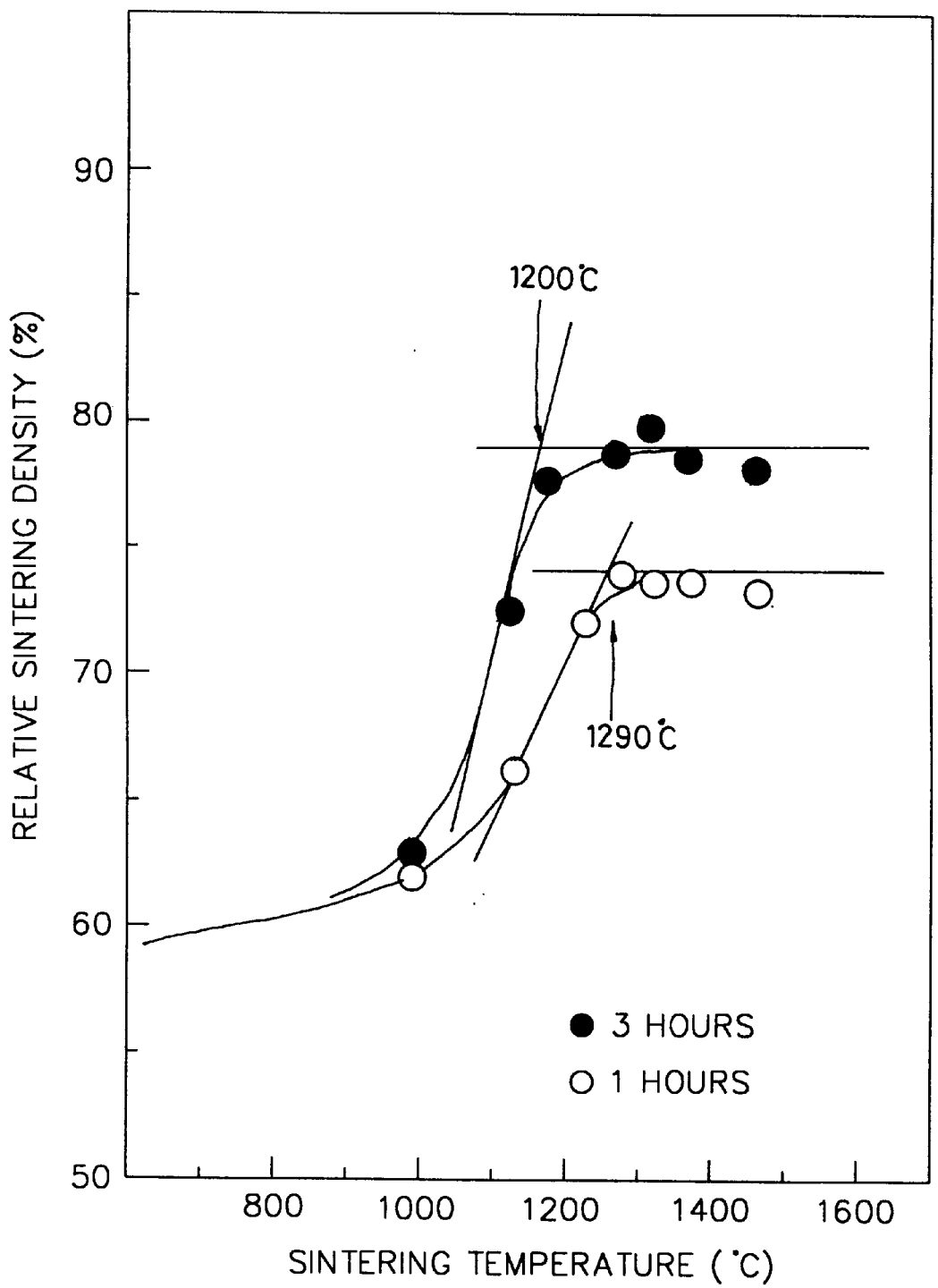
FIG. 2 is a graph illustrating relative sinterred density variation curves with regard to the W—Ni(0.037 wt %) powder when a sintering was carried out at a temperature of 1000~1500° C. for one hour and three hours.

Referring to FIG. 2, when the sintering time is adjusted in a temperature range of 1200~1300° C., a skeleton structure having a relative sinterred density of 20% porosity (10 weight percent of copper) by use of a W—Ni(0.037 wt %) powder is obtained through the sintering at 1200° C. for 3 hours. When the sintering temperature was increased to 1500° C., the porosity remained virtually unchanged at about 20%.

Figure 3A:
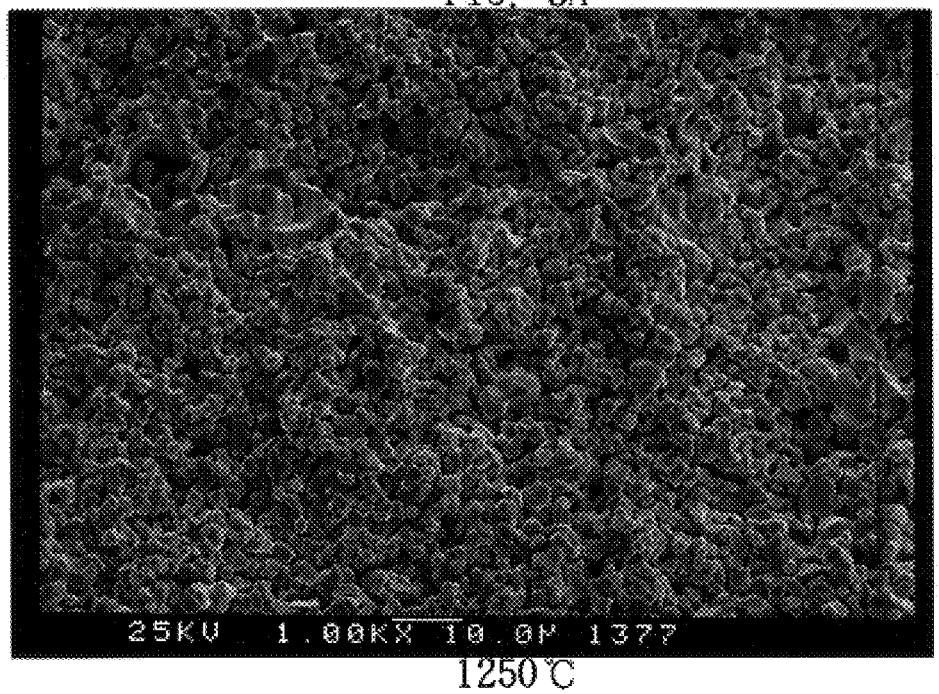
FIGS. 3A and 3B are the pictures taken by a scanning electron microscope on fracture surfaces of the W—Ni (0.037 wt %) body sintered at temperatures of 1250° C. and 1500° C. for one hour, respectively.
Figure 3B:
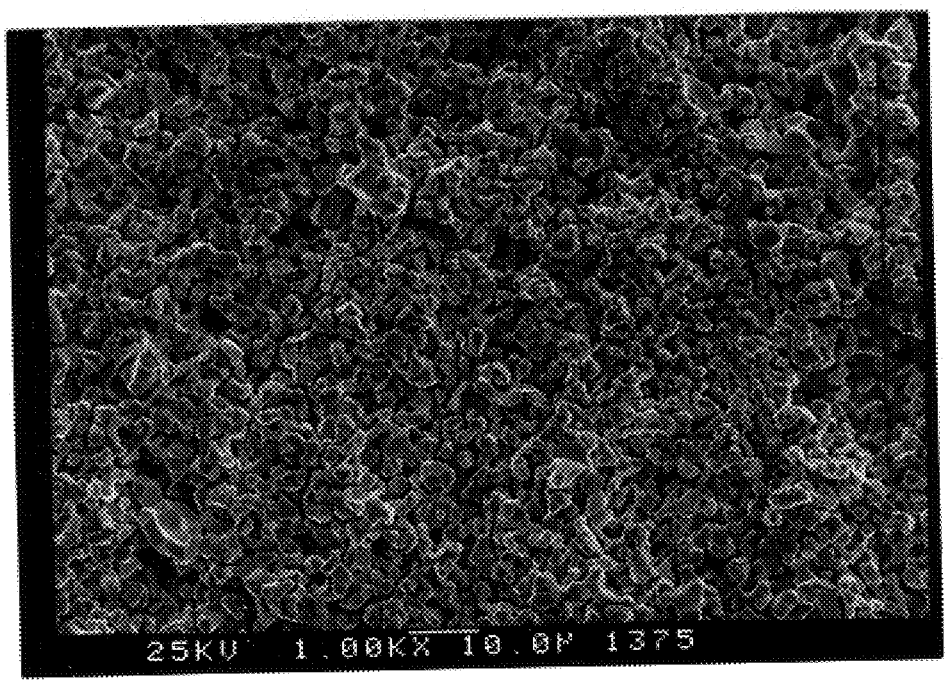

FIGS. 3A and 3B respectively illustrate a fractured surface structure observed by scanning electron microscopy after the respective W—Ni(0.037 wt %) powders are sintered at temperatures of 1250° C. and 1500° C. Although there is a sintering temperature difference of 250° C., the tungsten particles remain similar in size, and have an open pore structure with a porosity of 20%. Whereas the pure tungsten requires a temperature of about 1800° C. to obtain a porosity of 20%, the temperature difference between the pure tungsten and tungsten with nickel is 600° C. The nickel did not precipitate in the interfaces of the tungsten.

However, in a W—Ni(0.2 wt %) powder which has more than the amount of nickel indicated by the solubility of nickel for tungsten, a liquid phase nickel formed on the + at a temperature of higher than 1450° C. This occurs due to the residual nickel which remains after the nickel is dissolved into the tungsten, and although the skeleton structure is obtained, as illustrated in curve A in FIG. 1. The W—Ni(0.2 wt %) has a porosity of 20% after one hour of sintering at a temperature of 1250° C. below the temperature of liquid phase formation of nickel. However the remaining nickel becomes dissolved into the copper which is to be infiltrated, the residual nickel may be a reason that causes a reduction of the thermal conductivity.

The low temperature sintering of tungsten powder structure which minimizes the reduction of the thermal conductivity with an addition of transition metals thereto for copper infiltration is manufactured by coating nickel on the tungsten powder below the solubility of nickel for tungsten.

The tungsten-copper composite material being infiltrated by copper after combining a polymer binder with a W—Ni (0.037 wt %) powder, and carrying out an injection molding into a certain shape and an debinding will now be further described with reference to the following examples.

EXAMPLE 1

A surface of a tungsten powder having a purity of 99.97% and 2~5 micron in size was coated with a 0.037 wt % of nickel using a coating method of organometallic compound decomposition. In order to carry out a powder injection molding, an injection admixture was manufactured by combining a source powder with a polymer binder formed by admixing paraffin, polyethylene, and stearic acid. The volume ratio of the polymer binder and the source powder in the admixture was 45% and 55% respectively.

The admixture was molded into a plate of 10 mm in width, 20 mm in length, and 5 mm in height by the injection process. A part of polymer binder of the injection molded body is partly eliminated by a solvent extraction method using n-heptane solution. The remaining polymer binder was entirely eliminated by a thermal decomposition. The relative density (=[sintering density/19.3]×100) of the binder-free molded body was 58%. The resultant injection molded body (10.6 g) was maintained for one hour under hydrogen atmosphere at a temperature of 1250° C. and sintered to have a porosity of 27% (relative sintering density of 73%). The sintered body having the porosity of 27% which denotes a weight percent of about 15%, was infiltrated with copper and placed in a tube furnace for two hours under a hydrogen atmosphere at a temperature of 1150° C., thereby obtaining a final tungsten-copper composite material, wherein an oxygen-free copper plate of 2.2 g which is 2% more in weight percent than the copper amount (1.87 g) required to fill the entire pores was prepared and put on the upper surface of the plate-shaped sintering body. The remaining copper after infiltration of liquid Cu into the sintered body is homogeneously distributed onto the surface which was in contact with the copper plate. The tungsten-copper composite material fabrication by use of the copper infiltration was resulted in the 16.5 g/cm³ of density measured after polishing and removing the upper surface of the sintered body which had been in contact with the copper plate during the copper infiltration. The theoretical density of the tungsten-copper composite material composed of 85 weight percent of tungsten and 15 weight percent of copper is 16.5 g/cm³.

EXAMPLE 2

A plate-shaped tungsten molded body provided in the same method as in Example 1 was maintained for three hours under a hydrogen atmosphere at a temperature of 1350° C. and sintered to have a porosity of 20% (relative sintering density of 80%). An oxygen-free copper plate of 1.45 g which is 2% more in weight percent than the copper amount required to fill the sintered body having a porosity of 20% which corresponds to 10 weight percent, was prepared and put on the upper surface of the plate-shaped sinterred body, and then infiltrated with copper for two hours under hydrogen atmosphere at a temperature of 1250° C. As indicated in Example 1, the melted (liquid) copper was infiltrated along open pores in the sintered body for thereby obtaining an expected W—Cu(10 wt %) composite material.

As described above, when the injection molding is carried out only using the metallic powder by adding thereto an amount of nickel below the solubility, a nickel precipitation at tungsten grain boundary and an uneven shrinkage of the injection molded body during the sintering may be prevented, for thereby decreasing the production cost of the tungsten skeleton structure and the tungsten-copper composite material.

What is claimed is:

1. A tungsten skeleton structure fabrication method, comprising the steps of:

forming a source powder by coating a tungsten powder surface having a purity of 99.9 weight percent and 2~5 $\mu$m in size, with nickel by less than 0.06 weight percent (600 ppm);

forming an admixture by admixing the source powder and a polymer binder;

carrying out a powder injection molding with regard to the admixture; and obtaining a tungsten skeleton structure by removing the polymer binder from the resultant injection molded body.

2. A method for fabricating tungsten-copper composite comprising the steps of:

forming a source powder by coating a tungsten powder surface having a purity of 99.9 weight percent and 2~5 $\mu$m in size, with nickel by less than 0.06 weight percent (600 ppm);

forming an admixture by admixing a source powder and a polymer binder;

carrying out a powder injection molding with regard to the admixture;

obtaining a tungsten skeleton structure by removing the polymer binder from the resultant injection molded body;

fabricating the obtained tungsten skeleton structure to have a porosity of 15~40% by sintering the tungsten powder coated with nickel structure at a temperature ranging from 1000~1500° C. for 0.5 through 5 hours; and providing a copper plate beneath the tungsten skeleton structure and carrying out a copper infiltration at a temperature between 1150° C. and 1250° C. under a hydrogen atmosphere for 2 hours.

* * * * *

UNITED STATES PATENT AND TRADEMARK OFFICE
CERTIFICATE OF CORRECTION

PATENT NO. : 5,963,773
DATED : October 5, 1999
INVENTOR(S) : Myoung Ki Yoo et al.

Page 1 of 1

It is certified that error appears in the above-identified patent and that said Letters Patent is hereby corrected as shown below:

<u>Column 3,</u>
Line 32, "15-40%" should read -- 15~40% --
Line 36, "1150°C" should read -- 1150°C --

<u>Column 5,</u>
Lines 27 and 28, "on the + at a temperature" should read -- on the tungsten grain boundary at a temperature --
Line 39, "tungsten powder structure which" should read -- tungsten powder which --

Signed and Sealed this

Ninth Day of April, 2002

*Attest:*

*Attesting Officer*

JAMES E. ROGAN
*Director of the United States Patent and Trademark Office*